US010985488B1

(12) United States Patent
Goh et al.

(10) Patent No.: US 10,985,488 B1
(45) Date of Patent: Apr. 20, 2021

(54) ELECTRICAL CONTACT, CONNECTOR AND METHOD OF MANUFACTURE

(71) Applicant: BeCe Pte Ltd, Singapore (SG)

(72) Inventors: Hiang Kwee Goh, Singapore (SG); Seow Meng Low, Singapore (SG)

(73) Assignee: BeCe Pte Ltd, Singapore (SG)

( * ) Notice: Subject to any disclaimer, the term of this patent is extended or adjusted under 35 U.S.C. 154(b) by 0 days.

(21) Appl. No.: 16/777,856

(22) Filed: Jan. 30, 2020

(51) Int. Cl.
  *H01R 13/24* (2006.01)
  *H01R 13/03* (2006.01)
  *G01R 1/067* (2006.01)
  *H01R 43/16* (2006.01)

(52) U.S. Cl.
  CPC ..... *H01R 13/2407* (2013.01); *G01R 1/06722* (2013.01); *G01R 1/06738* (2013.01); *G01R 1/06761* (2013.01); *H01R 13/03* (2013.01); *H01R 13/2485* (2013.01); *H01R 13/2492* (2013.01); *H01R 43/16* (2013.01); *H01R 2201/20* (2013.01)

(58) Field of Classification Search
  CPC .......................... H01R 12/523; H01R 12/526
  See application file for complete search history.

(56) References Cited

U.S. PATENT DOCUMENTS

| | | | | |
|---|---|---|---|---|
| 6,848,914 B2 * | 2/2005 | Beaman | ................. | H01R 12/52 439/66 |
| 7,029,288 B2 * | 4/2006 | Li | ......................... | H01L 21/486 257/E23.067 |
| 8,758,067 B2 * | 6/2014 | Rathburn | ............... | H01R 12/57 439/700 |
| 10,056,707 B2 * | 8/2018 | Anderson | .............. | H01R 13/03 |
| 10,312,623 B2 * | 6/2019 | Kim | ..................... | H01R 13/62 |
| 2006/0211276 A1 * | 9/2006 | Li | ...................... | H01R 13/2464 439/66 |
| 2020/0056671 A1 * | 2/2020 | Akada | ..................... | C22C 38/22 |

* cited by examiner

*Primary Examiner* — Ross N Gushi
(74) *Attorney, Agent, or Firm* — Idea Intellectual Limited; Margaret A. Burke; Sam T. Yip

(57) ABSTRACT

An electrical contact and connector (also known as elastic electrical contact and system) are disclosed herein for testing semiconductor devices such as integrated circuit (IC) packages, particular high density IC packages. The elastic electrical contact comprises a plurality of interlaced or interwove and unsupported conductive wires. The electrical contact system comprises the elastic electrical contacts and a carrier having a plurality of through openings. The elastic electrical contacts are placed in their respective through openings with both ends exposed from the through openings. Method of making and using the elastic electrical contact are also provided.

9 Claims, 16 Drawing Sheets

(a)  (b)

(a)

(b)

(a)

(b)

(a)

(b)

(a)

(b)

ELECTRICAL CONTACT, CONNECTOR AND METHOD OF MANUFACTURE

FIELD OF THE INVENTION

The present application relates to an electrical contact and/or connector, which is also known as an elastic electrical contact and system for integrated circuit (IC) packages, particular for high density IC packages. The present application alternatively relates to Electrical Contact, Connector and/or Method of Manufacture, or Electrical Contact, Electrical Connector and/or Method of Manufacturing. The present application also relates to a method of manufacturing (also known as a method of making) the elastic electrical contact, and a method of using the elastic electrical contact.

BACKGROUND OF THE INVENTION

Currently a high density IC package is electrically connected to a substrate (such as Printed Circuit Board (PCB)) by direct soldering Land Grid Array (LGA), Pin Grid Array (PGA) or Ball Grid Array (BGA) attached at a bottom surface of the IC package to the substrate. Although the direct soldering method has a low manufacture cost, the direct soldering technology creates several significant problems in relation to inspection and correction of any resulting soldering faults. In addition, the direct soldering permanently fixes the IC package to the substrate and thus is not suitable for testing of the IC package.

SUMMARY OF THE INVENTION

Therefore, the present application discloses an elastic electrical contact that does not need to be permanently fixed to the IC package and the substrate. The elastic electrical contact thus may be used as either a production socket for permanently connecting the IC package to the substrate or a test socket for temporarily connecting the IC package to the substrate. In contrast to traditional elastic electrical contact where a dielectric core is engaged for providing electric energy storage, the elastic electrical contact of the present application may have conductive wires only. In other words, the conductive wires on one hand has a good electrical conductivity and on the other hand has a sufficient spring property and thus may rebound to their original positions after the elastic electrical contact is removed from the substrate and the IC package. In addition, the elastic electrical contact is also durable for testing more than 500 thousand life cycles.

As a first aspect, the present application discloses an elastic electrical contact. The elastic electrical contact comprises a plurality of interlaced (alternate, twine, interlace, interweave, braid, weave) and mutually supported wires. The interlaced and mutually supported wires comprise one or more electrically conductive wires for providing a first electrical contact and a second electrical contact. A first external electrical device (such as an IC package) and a second external device (such as a substrate) are electrically connected via the elastic electrical contact by placing the first external device and a second external device in electrical contact with the first electrical contact and the second electrical contact of the elastic electrical contact respectively. In some implementations, the elastic electrical contact comprises six conductive wires interlaced or interwove together. In other implementations, the elastic electrical contact comprises eight conducive wires interlaced or interwove together.

The conductive wire optionally comprises a sharp edge for scratching an electric contacting surface of an external electrical device. In particular, the scratching is conducted in a nanometer scale (less than 1 micrometer). The scratching removes any surface contamination or oxidation of the external electrical device for establishing a physical connection between the elastic electrical contact and the external electrical device. The conductive wire optionally has a first sharp end and a second sharp end for providing a first scratch and a second scratch to the first external electrical device and the second external electrical device respectively in a nanometer scale. In some implementations, the first sharp end or the second sharp end has a single sharp extremity for forming the scratching. In other implementations, the first sharp end or the second sharp end has two or more tiny intrusions. Meanwhile, the conductive wire does not damage the external electrical device since the scratching is controlled in a nanometer scale. Therefore, the first external electrical device and the second external electrical device are reliably connected electrically via the conductive wire of the elastic electrical contact.

The plurality of interlaced and mutually supported wires optionally comprise three or more discrete wires in forming a unitary structure. The wires (including the conductive wire) are not only unsupported by any foreign object but also discrete and independent to each other. As a result, the discrete wires may move within a limited range while maintaining the unitary structure. In other words, the unitary structure has an elastic deformation. In particular, the elastic deformation is not homogeneous along the unitary structure. A first portion and a second portion near the first sharp end and the second sharp end respectively undergo a larger elastic deformation; while a middle portion between the first portion and the second portion undergoes a smaller deformation.

The unitary structure comprises a tubular structure (cylinder, wall or shape). The tubular structure comprises one or more open ends having the sharp edges. The tubular structure has a spring property for reversibly storing and releasing mechanical energy. In other words, the tubular structure can be compressed longitudinally under an axial loading from a resting position and then rebound substantially to the resting position after the axial loading is removed. In the elastic deformation process, each wire would only exhibit a bending property wholly consistent with an elastic limit portion of its underlying material's characteristic "stress-strain" or "force-deflection" curve.

In some implementations, the wire is manipulated into a helical configuration by being interlaced with each adjacent wire in the tubular structure. The tubular structure is characterized by a tubular diameter and a pitch or a lead. The tubular structure has a compression ratio no more than 30% in a cylindrical or longitudinal direction of the tubular structure. In other words, the minimum length under the compression force needs to be at least 70% of the original length without the compression force.

Every two of the interlaced and mutually supported wires cross each other in forming an intersection point (i.e. crossing & contacting each other) on a cylindrical wall of the tubular structure. As discussed above, the discrete and independent wires are not coupled or adhered at the intersection point; and thus the wires are movable at the intersection point in relation to the other overlapped wire. In addition, the tubular structure has one or more leads. The lead is defined as a distance between a first intersection point and a second intersection point in an axial plane for a same wire. The wire winds around the tubular structure, starting from the first intersection point and then ending at the second intersection point in the axial plane.

Every wire of the interlaced and mutually supported wires optionally crosses another wire in forming at least one intersection point. The distance between two immediately neighboring intersection points in a longitudinal or cylindrical direction of the tubular structure is measured as the pitch. In some implementations, the pitches are substantially equal the same. In some implementations, the lead has four pitches in the axial plane when the tubular structure has eight wires braided and mutually supported. Therefore, the distance of the lead equals to four spans of the pitches in the axial plane. The tubular structure thus may be measured by the either the lead or the pitch. The original length of the tubular structure is optionally in a range of 50 to 100 mils for providing a compact and free-standing properties to the tubular structure. The tubular structure has a flexible design in terms of the tubular diameter, the lead and a wire diameter of the wire. In some implementations, the wire diameter is around 1.2 mil; while the tubular diameters are selected around 5 mils, 6 mils and 8 mils respectively when the leads are set around at 25 mils, 26 mils and 30 mils. In other implementations, the wire diameter is around 0.85 mil; while the tubular diameter is selected around 3 mils when the lead is set around at 15 mils.

The two or more intersecting or crossing wires optionally form a substantially right angle in-between in the absence of external force (e.g. in a resting position or influenced by gravity only). The two wires at the intersection point form an angle which may slightly vary since the two wires are movable around the intersection point. The angle has a variation within 10 degrees, i.e. from 80 degrees to 100 degrees. The substantially right angle helps the tubular structure rebound to the resting position after the axial loading is removed.

The conductive wire is a single most critical factor for the elastic electrical contact to electrically connect the first external device and a second external device. Therefore, the conductive wire is required to have several attributes, such as high electrical conductivity (or low electrical resistance), high durability under repeated deflections, being capable of transmitting high frequency signals, being capable of withstanding elevated operating temperatures; chemical stability (such as not easily oxidized in an ambient environment), and high mechanical strength. The conductive wire comprises multiple layers of different materials (i.e. a multiple-layer structure). The conductive wire inherently has a sufficiently high elastic range due to its unique multiple-layer structure. The conductive wire may also undergo an annealing process for achieving an extended elastic range, in addition to the unique multiple layer structure.

The multiple-layer structure may comprise an inner layer made of materials that are elastic, resilient or flexible; and an cover, sleeve or plated layer (e.g. by plating) for encapsulating the inner layer for resisting corrosion (e.g. oxidization) or enhancing electrical conductivity of the at least one of interlaced and mutually supported wires between the first end and the second end. In addition, the inner layer also provides a mechanical strength for maintaining an integrity of the conductive wire. In some implementations, the inner layer comprises a steel material, such as stainless steel (e.g. stainless steel 302, 304 or 316), spring steel, memory steel and other similar shape-memory alloys (e.g. Nickel titanium (also known as Nitinol). In other implementations, the inner layer comprises metals of very low electrical resistivity (such as copper) for enhancing electrical conductivity of the conductive wire.

The cover layer may further comprise a Nickel (Ni) layer plated on the inner layer (i.e. Ni plating layer) for encapsulating the inner layer and a Gold layer plated on the Nickel layer (i.e. Au plating layer) for encapsulating the Nickel layer. The Nickel plating layer and the Gold plating layer are also used for further enhancing the electrical conductivity of the elastic electrical contact, since Nickle and Gold have electrical resistivities of around $6.99 \times 10^{-8}$ Ohm Meter ($\Omega \cdot m$) (i.e. electrical conductivity of around 14.3 million siemens per meter) and $2.44 \times 10^{-8}$ Ohm Meter ($\Omega \cdot m$) (i.e. electrical conductivity of around 41.1 million siemens per meter) respectively at room temperature (i.e. 20° C.). In addition, the Gold plating layer also prevents oxidation of the inner layer and the Nickel plating layer. In some implementations, a Palladium layer is first plated on the Nickel layer (i.e. Pd plating layer) before the Au plating layer. In other words, the Pd plating layer is located between the Ni plating layer and the Au plating layer. The Pd plating layer further lowers the electrical resistivity since Palladium has an electrical conductivity of around $1.06 \times 10^{-8}$ Ohm Meter ($\Omega \cdot m$) (i.e. electrical conductivity 9.43 per million siemens per meter) at room temperature (i.e. 20° C.); while the Palladium plating layer also provides additional mechanical strength (such as hardness) to the cover layer. In particular, the Au plating layer has an Au thickness more than 1.0 micrometer ($\mu m$); while the Ni plating layer and the Pd plating layer respectively have a Ni thickness and a Pd thickness that are both less than 1.0 micrometer ($\mu m$).

The cover layer optionally further comprises a Copper layer plated on the inner layer (i.e. Cu plating layer) for encapsulating the inner layer, in particular when the inner layer is made of non-Copper alloys. Since stainless steel has a relatively high electrical resistivity of $6.90 \times 10^{-7}$ Ohm Meter ($\Omega \cdot m$) (i.e. electrical conductivity of around 1.4 million siemens per meter) at room temperature (i.e. 20° C.), the Copper plating layer is used for enhancing the electrical conductivity of the elastic electrical contact. Copper has an electrical resistivity of $1.68 \times 10^{-8}$ Ohm Meter ($\Omega \cdot m$) (i.e. electrical conductivity of around 60 million siemens per meter) at room temperature (i.e. 20° C.). In particular, high performance Copper or high strength copper (such as C17510 copper alloy) is optionally used for enhancing the electrical conductivity. Similarly, the Cu plating layer has a Cu thickness of more than 2.0 micrometer ($\mu m$).

The multiple layers structure optionally further comprise an outer layer for encapsulating both the inner layer and/or the cover layer for preventing corrosion to the inner layer and/or the cover layer. In some implementations, the outer layer comprises a self-assembled-molecules (SAM) layer for further preventing oxidation of the cover layer and/or the inner layer. The SAM layer comprises a plurality of multiple-functional molecules having an anchoring group for attaching to the cover layer and a plurality of functional groups opposite to the anchoring groups for enhancing corrosion and wear resistance. If electrons are transferable among the multiple-functional molecules, the SAM layer may provide additional electrical conductivity to the conductive wire; and an electrical routine is thus formed between adjacent conductive wires that are in direct contact. If electrons are not transferable among the multiple functional molecules, such electrical routine is not formed and thus such adjacent conductive wires are insulating to each other. In some implementations, the SAM layer is formed on the cover layer, and thus the SAM layer prevents oxidation of the cover layer; and the Gold layer may have a thin thickness for cost saving. In some implementations, the SAM layer is directly formed on the inner layer for preventing oxidation of the inner layer. In either implementations, the SAM layer is optionally less than 0.5 micrometer (μm). Alternatively, the outer layer comprises a parylene coating for providing a superior pinhole-free, uniform barrier resistant to various chemicals (such as organic solvents, inorganic reagents, acids, oxygen, corrosive liquids and gases, and moisture). In addition, the parylene coating also has superior electrical insulation and low electric constant.

The multiple layers optionally further comprise an insulating layer enwrapping, enclosing, enveloping, surrounding the cover layer fully or partially, The cover layer is exposed from the insulating layer around the first end and second end of the elastic electrical contact. The insulating layer prevents any electrical interference between adjacent elastic electrical contacts for enhancing signal transmission. The insulating layer may be made of any insulating material including but not limited to fiberglass, mineral wool, cellulose, natural fibers, synthetic polymers (such as polystyrene, polyisocyanurate and polyurethane), or synthetic foams (such as urea-formaldehyde foam, cementitious foam and phenolic foam).

The interlaced and mutually supported wires optionally comprise one or more supporting wires for upholding other wires. The supporting wires are also wound in a similar manner (such as helical path) and interlaced with the conductive wire for forming the unitary structure.

As a second aspect, the present application discloses an electrical contact system. The electrical contact system comprises a plurality of elastic electrical contacts described above; and a carrier (also known as housing) comprising a plurality of through openings. The housing is placed between the first external electrical device (such as IC packages) and the second external electrical device (such as substrate). The plurality of elastic electrical contacts are placed in the plurality of through openings respectively for electrically connecting the first and the second external electrical devices. The first end and/or the second end of the plurality of elastic electrical contacts are/is exposed from the through opening. In other words, the elastic electrical contact has a neutral length in a resting position; and the through opening of the housing has a depth. The neutral length is required to be longer than the depth. The through openings have a diameter that is slightly larger than that of the elastic electrical contacts for guiding the elastic electrical contact into the through opening.

The through openings are optionally arranged in an array corresponding to the first external electrical device. The electrical contact system may comprise a plurality of fasteners for fixing (attaching, fastening) the housing to an external electrical device. For example, the electrical contact system comprises a plurality of first fasteners for fixing the housing to the first external electrical device after the elastic electrical contacts are aligned precisely to the first external electrical device. Similarly, the electrical contact system also comprises a plurality of second fasteners for fixing the housing to the second external electrical device after the elastic electrical contacts are aligned precisely to the second external electrical device. Therefore, an efficient electrical routine is established for an electrical signal to transmit from the first external electrical device to the second external electrical device via the electrical contact system.

The carrier or the housing optionally comprises a top layer, a bottom layer, and a middle layer sandwiched between the top layer and the bottom layer. The carrier works as an interposer for housing the elastic electrical contacts as well as providing mechanical support to the elastic electrical contacts. The top layer is optionally made of insulating materials (such as polyimide). The bottom layer is optionally also made of insulating materials (such as polyimide). The middle layer is optionally made of a thermal conductive material (such as Copper). The middle layer is thus used as a heat spreader for spreading heat generated by the electrical contact. The carrier may further comprise a top intermediate layer between the top layer and the middle layer for combining the top layer and the middle layer; and a bottom intermediate layer between the bottom layer and the middle layer for combining the bottom layer and the middle layer. In addition, the top intermediate layer optionally comprises a top adhesive layer (such as pure silicone); and the bottom intermediate layer optionally comprises a bottom adhesive layer (such as pure silicone). The pure silicone combines the top layer, the middle layer and the bottom layer under a heating and pressing condition into a monolithic structure.

As a third aspect, the present application discloses a method of making the elastic electrical contact described above. The method of making the elastic electrical comprising a step of providing a plurality of wires comprising one or more electrically conductive wires; a step of interlacing, alternating, twining, interweaving, braiding, weaving the plurality of wires in forming a unitary structure; a step of separating (e.g. cutting) the unitary structure into a plurality of elastic electrical contacts which are substantially identical or similar; and a step of plating the elastic electrical contacts for forming a multiple-layer structure. The least one conductive wire has a first electrical contact and a second electrical contact at its opposite ends. The conductive wire has a first electrical contact and a second electrical contact around a first end and a second end of the conductive wire respectively. The wires are optionally interlaced by using a bradding machine or braider. In some implementations, the wire is manipulated into a helical configuration for the unitary structure. The interlacing step may be conducted either vertically or horizontally.

Alternatively, the method of making the elastic electrical comprising a step of providing a plurality of wires comprising one or more electrically conductive wires; a step of plating the electrically conductive wires for forming the multiple-layer structure, a step of interlacing, alternating, twining, interweaving, braiding, weaving the plurality of wires in forming a unitary structure; and a step of separating (e.g. cutting) the unitary structure into a plurality of elastic electrical contacts which are substantially identical or similar.

The method of making the elastic electrical contact may further comprise a step of releasing an internal stress of the electrically conductive wire after the interlacing step (such as a annealing process) by firstly heating the unitary structure for reliving an internal stress of the conductive wire; and then cooling the unitary structure to a room temperature. The heating step is optionally conducted by a heat radiation process or thermal radiation process. Heat is transferred from a radiation source to the unitary structure until the unitary structure is heated to a temperature ranging from 200 to 500 Celsius degree for around 5 minutes. In the radiation heating process, the unitary structure is not in direct physical contact with the heat source such that the unitary structure may be configured to be heated substantially homogeneously. In addition, the heat radiation process is conducted in an inert environment (e.g. chamber fully filled nitrogen gas).

Alternatively, the heating step may be conducted by an induction heating process due to a ferromagnetic nature of the unitary structure. Heat is generated inside the conductive wire of the unitary structure by eddy currents induced by an induction heater. The induction heating process has several advantages. Firstly, the induction heating process may be conducted very rapidly. Secondly, the induction heating process does not involve any foreign substrate and thus can be conducted in an ambient environment. Thirdly, the induction heating process may be targeted or focused on the unitary structure and thus may heat the unitary structure very uniformly. In addition, the induction heating process is also conducted in an inert environment.

The conductive wire may be provided by a step of providing an inner layer as core; and a step of forming at least one plated layer for encapsulating the inner layer. The plated layer is formed by a step of plating a Copper layer onto the inner layer for encapsulating the inner layer; a step of plating a Nickel on the copper plated layer for encapsulating the Copper plating layer; and a step of plating a Gold layer for encapsulating the Nickel layer. The method of making the elastic electrical contact may further comprise a step of plating a Palladium layer between the Nickel plated layer and the Gold plated layer.

The method of making the elastic electrical contact may further comprises a step of forming an outer layer on the cover layer for encapsulating the inner layer and/or the at least one plated layer. In some implementations, the outer layer comprises a self-assembled molecule (SAM) layer. For example, the SAM layer is formed by placing the conductive wire into a precursor solution of multi-functional molecules. The multi-functional molecules would spontaneously anchor to the cover layer and arranged regularly in a certain configuration. In some implementations, the outer layer comprises a parylene coating (i.e. a poly-para-xylylene layer) by a parylene deposition process. The parylene deposition process is completed by three consequent stages. In the first stage (i.e. vaporization stage), parylene dimers in a power form are added into a vaporizer and then heated to 150° C. for changing to a vapor state. In the second stage (i.e. pyrolysis stage), the parylene dimer vapor is transferred to a pyrolysis furnace and then heated to 690° C. at a pressure of 0.5 Torr (around 67 Pascal) for forming parylene monomers. In the third stage (i.e. deposition stage), the conductive wire is firstly placed in to a coating chamber before the parylene monomers are introduced into the coating chamber. A portion of the parylene monomers form the polymer of poly-para-xylylene and meanwhile deposit and bond to an outside surface of the conductive wire. The parylene deposition process may further comprises an additional fourth stage of expelling excess parylene monomers from the coating chamber into an external liquid cold trap.

Alternatively, the method of making the elastic electrical contact may further comprise a step of forming an insulating layer on the cover layer and/or the outer layer. The insulating layer is optionally formed by rolling an insulating sheet around the cover layer and/or the outer layer.

As a fourth aspect, the present application discloses a method of using the elastic electrical contact described above. The method of using the elastic electrical contact comprises a step of providing one or more elastic electrical contacts; a step of disposing the elastic electrical contacts onto or into a second external electrical device; and a step of disposing a first external electrical device onto the elastic electrical contact. The elastic electrical contact is slightly compressed of not more than 30% in length between the first external electrical device and the second external electrical device. In particular, the elastic electrical contact is so robust that it may be kept almost intact after being removed from the first and second external electrical device. Therefore, the elastic electrical contact may be reusable as either a production socket or a test socket.

The elastic electrical contact has a first end and a second end at opposite ends of the elastic electrical contact in direct contact with the first external electrical device and the second external electrical device respectively. At least one of the first end and the second end are configured to scratch a surface of the first external electrical device and the second external electrical device in a nanometer scale respectively for improving electrical contact.

The method of using the elastic electrical contact may further comprise a step of providing a carrier having one or more through openings; a step of placing the carrier (i.e. housing) onto the second external electrical device; and a step of inserting the elastic electrical contacts into the through openings.

The method of using the elastic electrical contact may further comprise a step of fastening the carrier onto the first external electrical device, the second external electrical device or both. The elastic electrical contact is aligned precisely to the first external electrical device and/or the second external electrical device before the fastening step is conducted.

The method of using the elastic electrical contact may further comprise a step of disposing a contact pad between the elastic electrical contact and the first external electrical device, the second electrical device or both. The contact pad (such as solder pad or copper column) is adopted for further providing good and reliable electrical connections between the elastic electrical contact and the first external electrical device and/or the second external electrical device.

As a fifth aspect, the present application discloses a method of making a carrier for an elastic electrical contact. The method of making the carrier comprises a step of providing a top layer, a middle layer and a bottom layer; a step of stacking the top layer, the middle layer and the bottom layer in place; a step of assembling the top layer, the bottom layer and the middle layer into the carrier as a monolithic structure; and a step of making a plurality of through openings throughout the top layer, the middle layer and the bottom layer.

The method of making the carrier may optionally comprise a step of providing a top intermediate layer and a bottom intermediate layer; a step of stacking the top intermediate layer between the top layer and the middle layer; a step of stacking the bottom intermediate layer between the middle layer and the bottom layer; and a step of assembling the top intermediate layer and the bottom intermediate layer with the top layer, the middle layer and the bottom layer. The assembling step may further comprise comprises a step of conducting a heating process to the carrier; and a step of conducting a pressing process to the carrier.

Alternatively, the method of making the carrier comprises a step of providing a top layer having a plurality of first through openings; a step of providing a middle layer having a plurality of second through openings; a step of providing a bottom layer having a plurality of third through openings; a step of aligning the top layer, the middle layer and the bottom layer by aligning the first through openings, the second through openings and the third through openings; and a step of assembling the top layer, the middle layer and the bottom layer into a monolith structure.

The method of making the carrier optionally comprises a step of providing a top intermediate layer having a plurality of fourth through openings; a step of providing a bottom intermediate layer having a plurality of fifth through openings; a step of aligning the top intermediate layer between the top layer and the middle layer by aligning the fourth through openings with the first through opening and the second through openings; a step of aligning the bottom intermediate layer between the middle layer and the bottom layer by aligning the fifth through openings with the second through opening and the third through openings; and a step of assembling the top intermediate layer and the bottom layer with the top layer, the middle layer and the bottom layer.

As a sixth aspect, the present application discloses a method of using an electrical contact apparatus. The method of using the electrical contact apparatus comprises a step of providing a first external electrical device and a second external electrical device; a step of connecting the electrical contact apparatus onto the second external electrical device; and a step of connecting the first external electrical device onto the electrical contact apparatus.

The method of using the electrical contact apparatus optionally comprises a step of aligning the electrical contact apparatus with top contact pads of the second external electrical device; and a step of aligning the electrical contact apparatus with bottom contact pads of the first external electrical device.

The electrical contact apparatus may be prepared by a step of providing a carrier having a plurality of through openings; a step of providing a plurality of elastic electrical contacts; a step of assembling the elastic electrical contacts with the carrier; and a step of transferring the electrical contact apparatus onto the second external electrical device. The assembling comprises inserting the elastic electrical contacts into their respective through openings. This inserting process may be conducted by any known method. The electrical contact apparatus may be prepared by a step of providing a carrier having a plurality of through openings; a step of providing a plurality of elastic electrical contacts; a step of placing the carrier onto the second external electrical device; and a step of assembling the elastic electrical contacts with the carrier.

BRIEF DESCRIPTION OF THE DRAWINGS

The accompanying figures (Figs.) illustrate embodiments and serve to explain principles of the disclosed embodiments. It is to be understood, however, that these figures are presented for purposes of illustration only, and not for defining limits of relevant applications.

DETAILED DESCRIPTION

Figure 1:
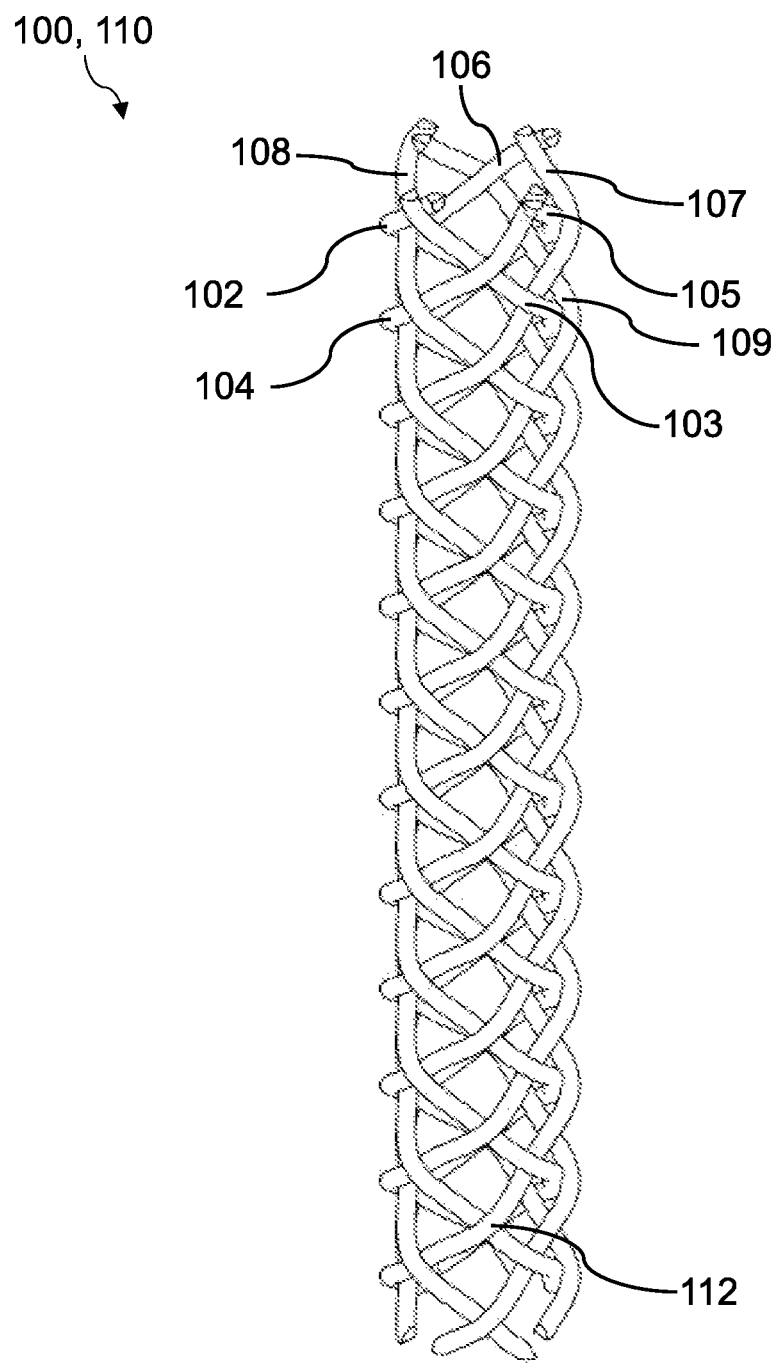
FIG. 1 illustrates a perspective view of an elastic electrical contact in a resting position.

FIG. 1 to FIG. 6 show an elastic electrical contact 100 having a single type (called first type) of conductive wire. FIG. 1 illustrates a perspective view of the elastic electrical contact 100 in a resting state or free position. The elastic electrical contact 100 comprises eight interlaced or interwove and unsupported wires 102-109, i.e. a first conductive wire 102, a second conductive wire 103, a third conductive wire 104, a fourth conductive wire 105, a fifth conductive wire 106, a sixth conductive wire 107, a seventh conductive wire 108 and an eighth conductive wire 109. The eight conductive wires 102-109 are interlaced together in a helical path for forming a unitary structure 110 in a tubular configuration. In particular, the unitary structure 110 does not need require a central support structure around which the conductive wires 102-109 are wound, or an outer or inner support structure within which the conductive wires 102-109 reside in. The conductive wires 102-109 belong to the first type and thus are substantially identical in materials, dimensions and other aspects.

Figure 2:
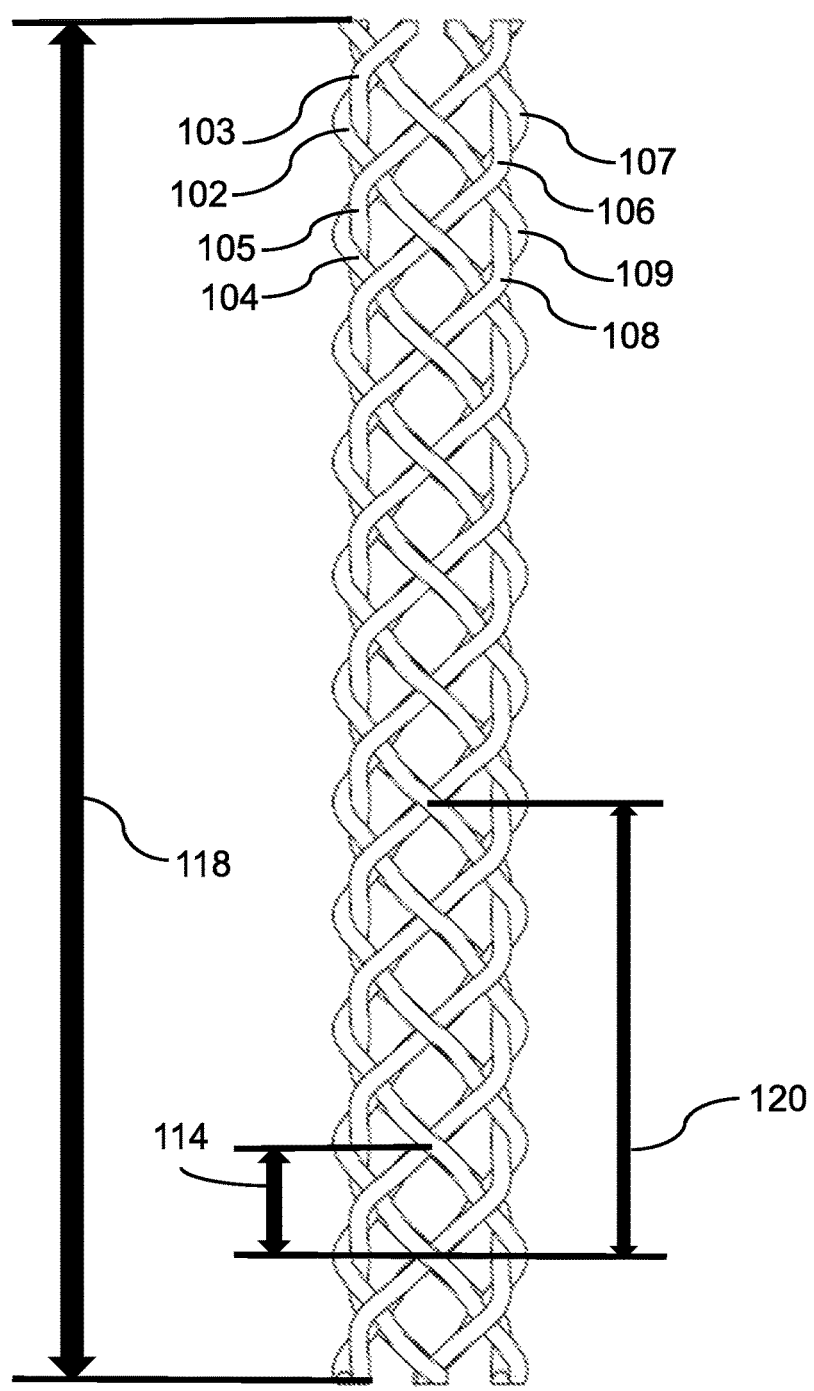
FIG. 2 illustrates a side view of the elastic electrical contact in the resting state.

FIG. 2 illustrates a side view of the elastic electrical contact in the resting state. In the unitary structure 110, every two of the eight conductive wires 102-109 are overlapped for forming an intersection point 112. In this way, the unitary structure 110 comprises a plurality of intersection points 112. The conductive wires 102-109 are simply overlapped at the intersection points 112. No physical, chemical or mechanical bonding or interconnection exists between the conductive wires 102-109 at the intersection points 112. Therefore, the conducive wires 102-109 are free to move at the intersection points 112. The unitary structure 110 is also characterized by a neutral length 118 in the resting state. In comparison, a pitch 114 is more often used that is defined as a distance between two adjacent intersection points 112. Since the conductive wires 102-109 are movable at the intersection points 112, the pitch 114 may be adjusted in a short range while the unitary structure 110 is not damaged. In particular, every two of the conductive wires 102-109 at each intersection point 112 are configured to form a substantially right angle (90 degrees) in the resting position. The right angle helps the unitary structure 110 rebound to the resting position from a compressed position and also form a stable structure at the resting position. In addition, the unitary structure 110 has a special parameter called lead 120. The lead 120 is measured as a distance between two adjacent intersection points 112 in an axial plane for a single conductive wire 102-109. As shown in FIG. 2, the lead 120 has four pitches 114 since the unitary structure 110 has four interlaced conductive wires 102-109. In the resting position, the lead 120 is limited to less 90 mils for maintaining the unitary structure 110 more stable.

Figure 3:
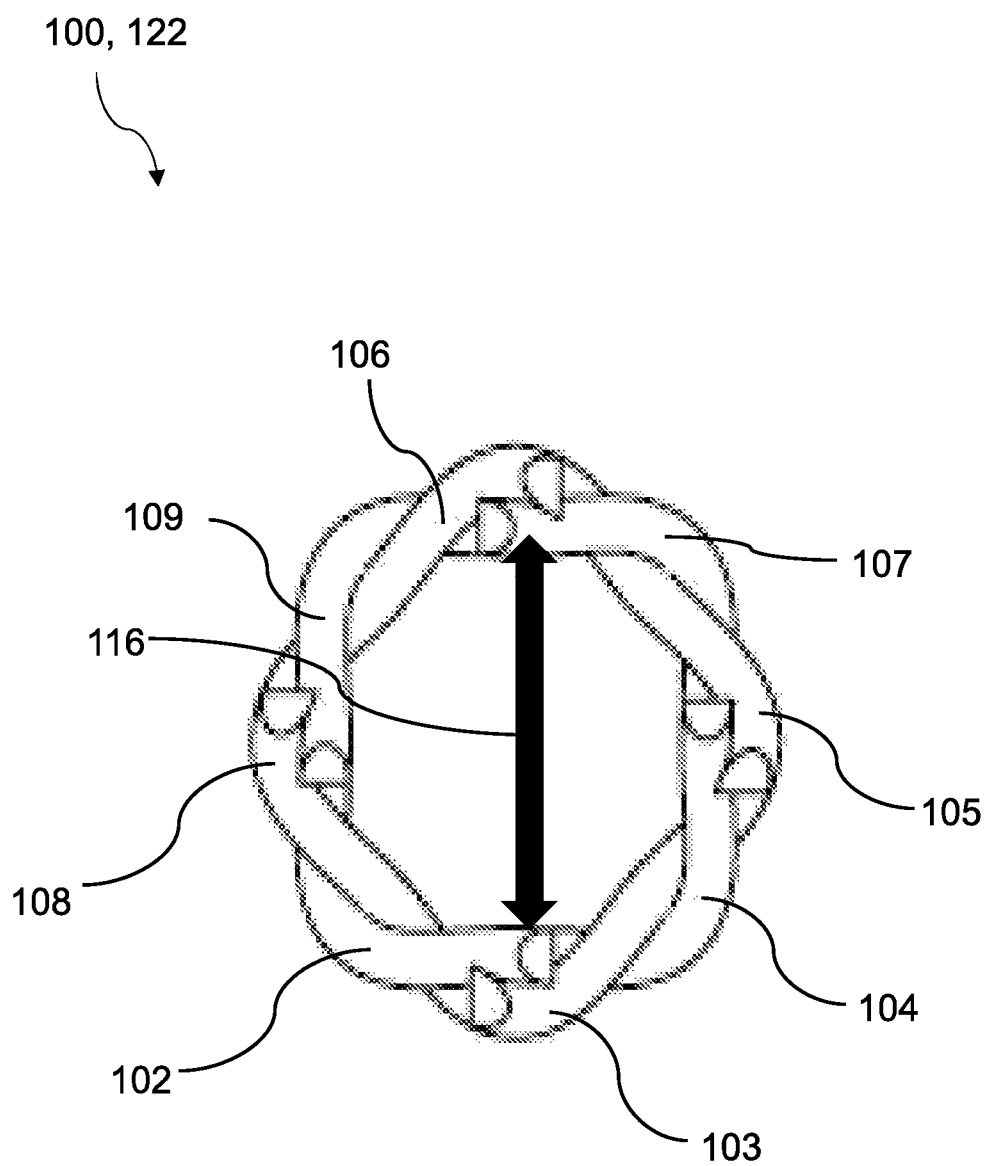
FIG. 3 illustrates a top view of the elastic electrical contact in the resting state.

FIG. 3 illustrates a top view of the elastic electrical contact 100 in the resting state. The unitary structure 110 is characterized by a neutral diameter 116 at a top end 122 of the unitary structure 110. It is clearly shown that no central support structure exists inside the unitary structure 110 where eight conductive wires 102-109 are interlaced together. The unitary structure 110 also has a bottom end 124 (not shown) opposite to the top end 122. The bottom end 124 has a similar structure with the top end 122. The top end 122 and the bottom end 124 would be in electrical contact with a IC device 126 as a first external electrical device and a print circuit board (PCB) 128 as a second external electrical device respectively. The elastic electrical contact 100 has a very high bulk conductivity (or very low bulk resistivity) such that the IC device 126 and the PCB 128 are efficiently electrically connected via the elastic electrical contact 100. The bulk conductivity is optionally in a range of 10 to 30 milliohms.

Figure 4:
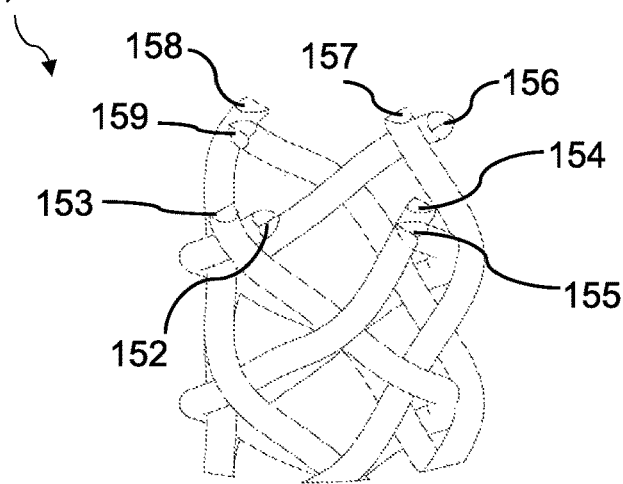
FIG. 4 illustrates an enlarged perspective view of a top end of the elastic electrical contact.

FIG. 4 illustrates an enlarged perspective view of the top end 122 of the elastic electrical contact 100. Each of the eight conductive wires 102-109 has a top sharp edge at the top end 122. In detail, the first conductive wire 102 has a first top sharp edge 152, the second conductive wire 103 has a second top sharp edge 153, the third conductive wire 104 has a third top sharp edge 154, the fourth conductive wire 105 has a fourth top sharp edge 155, the fifth conductive wire 106 has a fifth top sharp edge 156, the sixth conductive wire 107 has a sixth top sharp edge 157, the seventh conductive wire 108 has a seventh top sharp edge 158, and the eighth conductive wire 109 has an eighth top sharp edge 159. Similarly, each of the eight conductive wires also has a bottom sharp edge at a second end.

Figure 5:
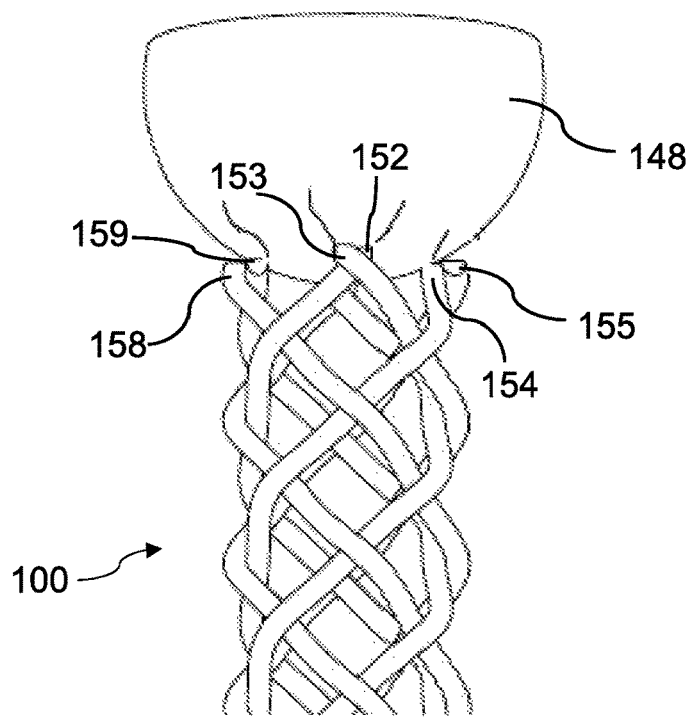
FIG. 5 illustrates a side view of a solder ball mounted on the elastic electrical contact at the top end.

FIG. 5 illustrates a side view of a solder ball 148 mounted on the elastic electrical contact 100 at the top end 122. It is clearly shown that the top sharp edges 152-159 at the top end 122 make multiple scratches to the solder ball 148 in a nanometer scale (less than 1 micrometer). The conductive wires 102-109 are slightly warped inside the solder ball 148 at the top end 122 such that the solder ball 148 is not catastrophically damaged by the conductive wires 102-109. In this way, the elastic electrical contact 100 has a physical contact with the solder ball 148 at the top end 122. Therefore, a reliable electrical connection is established between the elastic electrical contact 100 and the solder ball 148 regardless of any contamination on an outside surface of the solder ball 148. Since the solder ball 148 is further attached to the IC device 126, the elastic electrical contact 100 also set up a reliable electrical connection with the IC device 126. Similarly, the bottom end 124 also has a sharp edge for making scratches in a nanometer scale. Therefore, a reliable electrical connection would be also established between the elastic electrical contact 100 and the PCB 128. As a whole, an electrical current flows freely from the IC device 126 to the PCB 128 via the elastic electrical contact 100.

Figure 6:
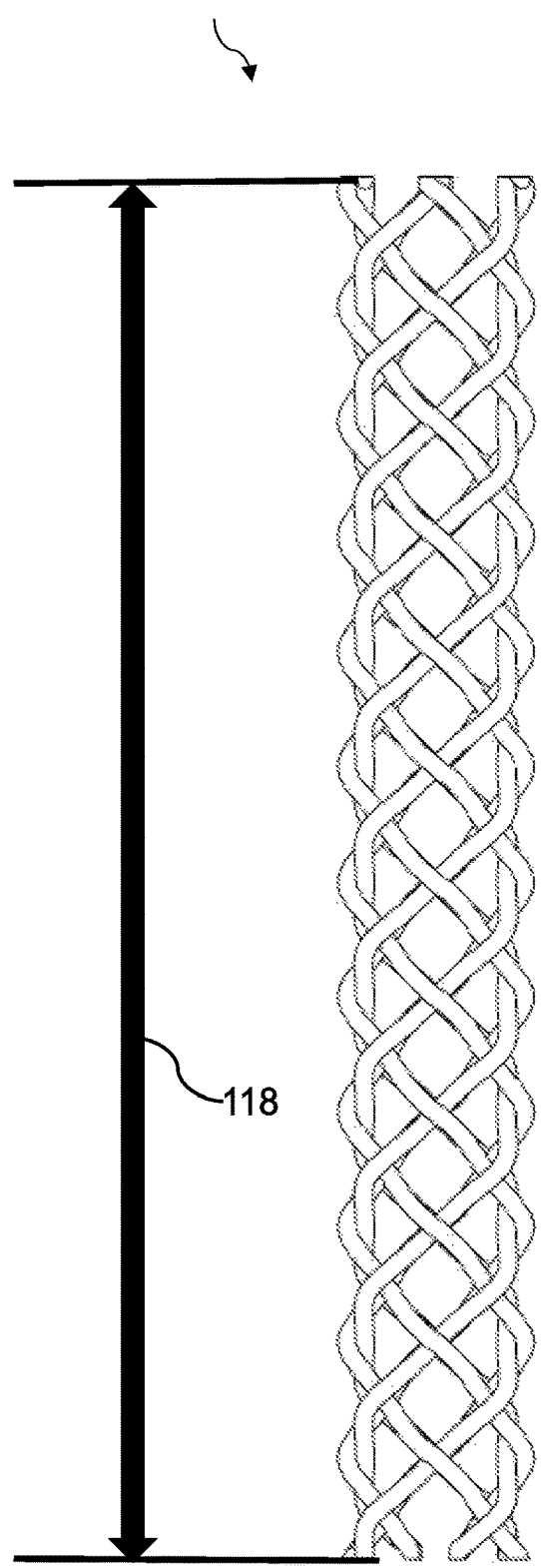
FIG. 6 illustrates a side view of the elastic electrical contact in the resting state (FIG. 6(*a*)) and a compressed state (FIG. 6(*b*))
Figure 6:
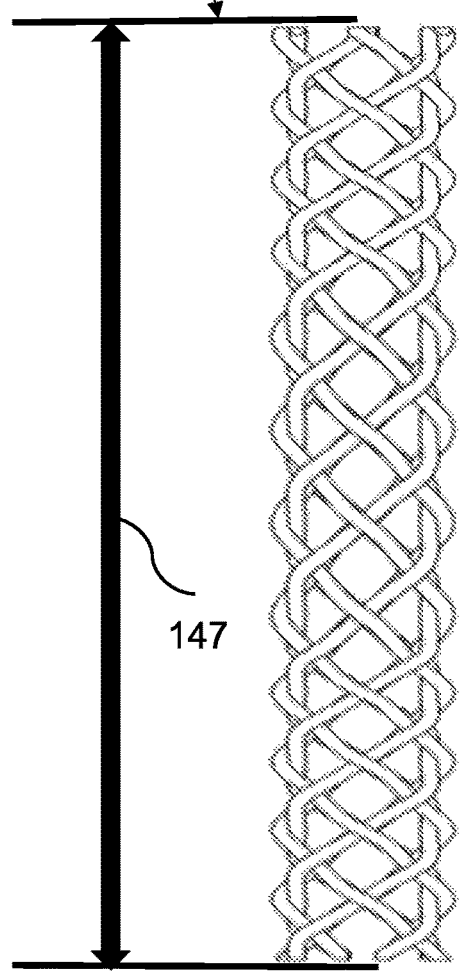

FIG. 6 illustrates a side view of the elastic electrical contact 100 in the resting state or resting position 144 (FIG. 6(a)) and a compressed state or compressed position 146 (FIG. 6(b)). When an axial loading or force is applied longitudinally, the unitary structure 110 undergoes an axial deformation from the resting state 144 to the compressed state 146. As shown in FIG. 6(b), the conductive wires 102-109 undergo a substantially elastic deformation only during the compression, i.e. the conductive wires 102-109 only exhibit a bending property wholly consistent with an elastic limit portion of their underlying material's characteristic "stress-strain" or "force-deflection" curve. In other words, substantially no plastic deformation is caused in the conductive wires 102-109 during the compression. As a whole, the elastic electrical contact 100 has a compressed length 147 in the compressed state 146. The unitary structure 110 has a typical compression ratio no more than 30%. In other words, the compressed length 147 accounts for no less than 70% of the neutral length 118.

Figure 7:
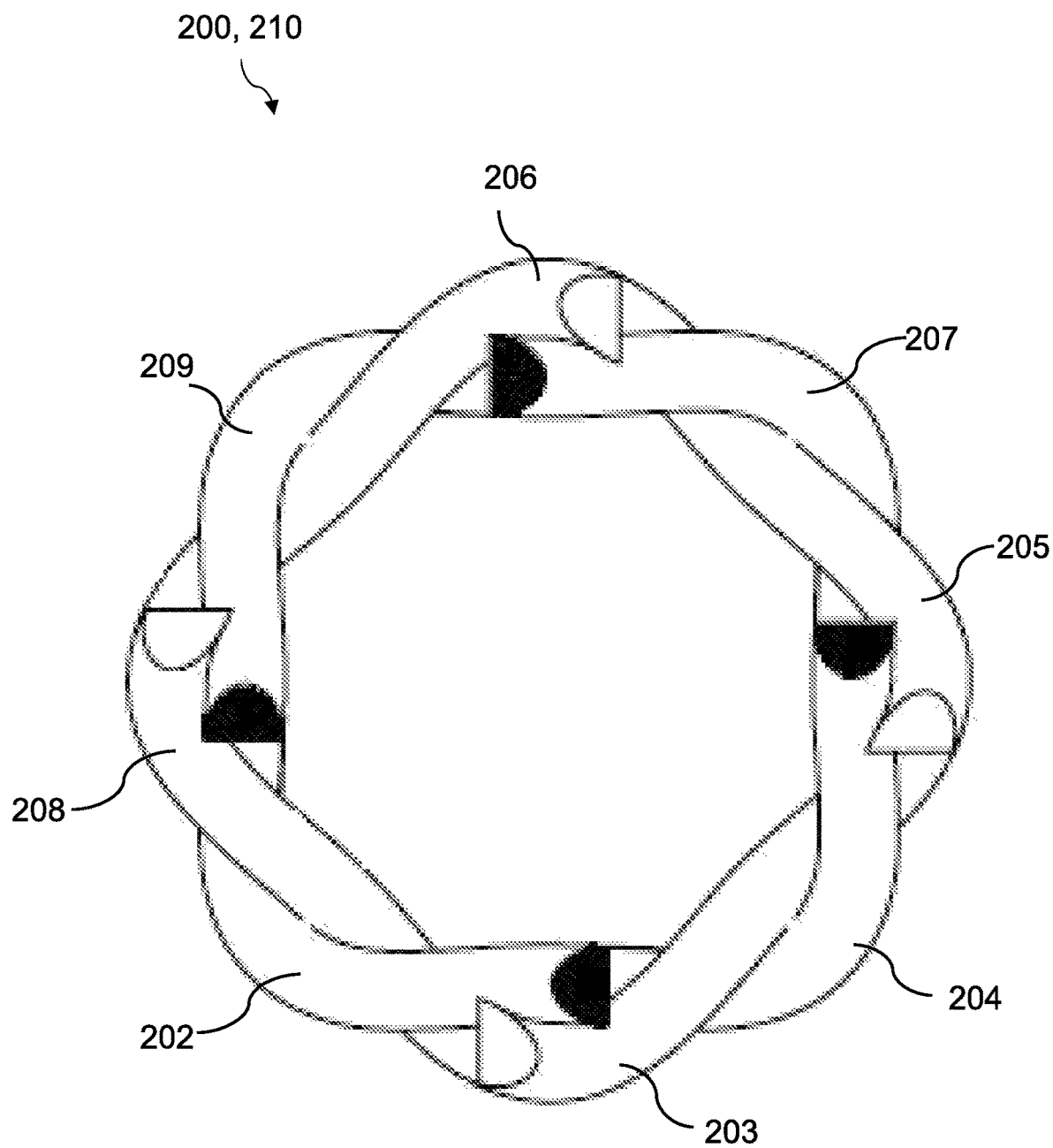
FIG. 7 illustrates a top view of another elastic electrical contact having two types of conductive wires.

FIG. 7 illustrates a top view of another elastic electrical contact 200 having two types of conductive wires. In detail, the elastic electrical contact 200 has a first conductive wire 202, a second conductive wire 203, a third conductive wire 204, a fourth conductive wire 205, a fifth conductive wire 206, a sixth conductive wire 207, a seventh conductive wire 208 and an eighth conductive wire 209. The elastic electrical contact 200 has a similar structure with the elastic electrical contact 100 except that the elastic electrical contact 200 has two types of conductive wires. In detail, the conductive wires 203, 205, 206, 208 belong to the first type; while the conductive wires 202, 204, 207, 209 belong to the second type. The conductive wires 202-209 are also wound in a helical path and interlaced for forming the unitary structure 210. In particular, the conductive wires 203, 205, 206, 208 of the first type comprise stainless steel or memory steel for providing an additional spring force for assisting the elastic electrical contact 200 to rebound to the resting position after the axial loading is removed; while the conductive wires 202, 204, 207, 209 of the second type comprises copper or other metals of high conductivities for providing sufficient electrical conductance to the elastic electrical contact 200.

Figure 8:
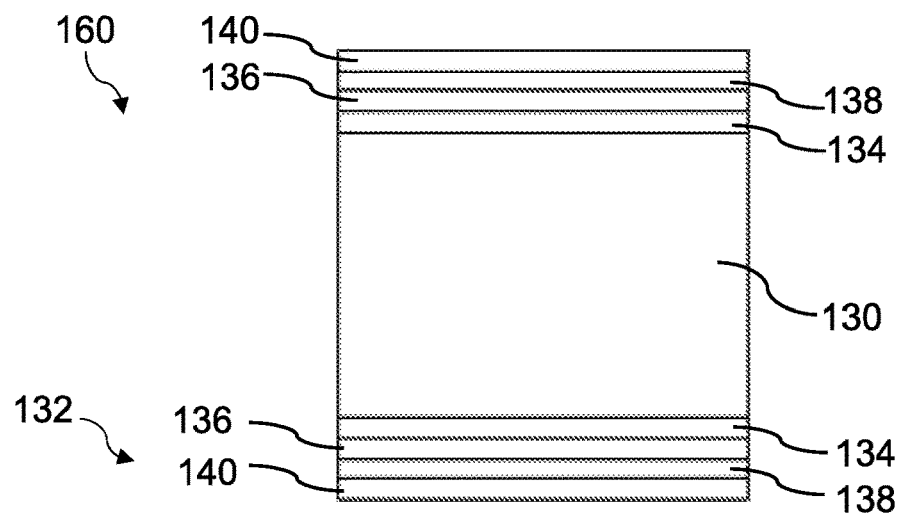
FIG. 8 illustrates cross-sectional views of a first embodiment of a conductive wire.
Figure 8:
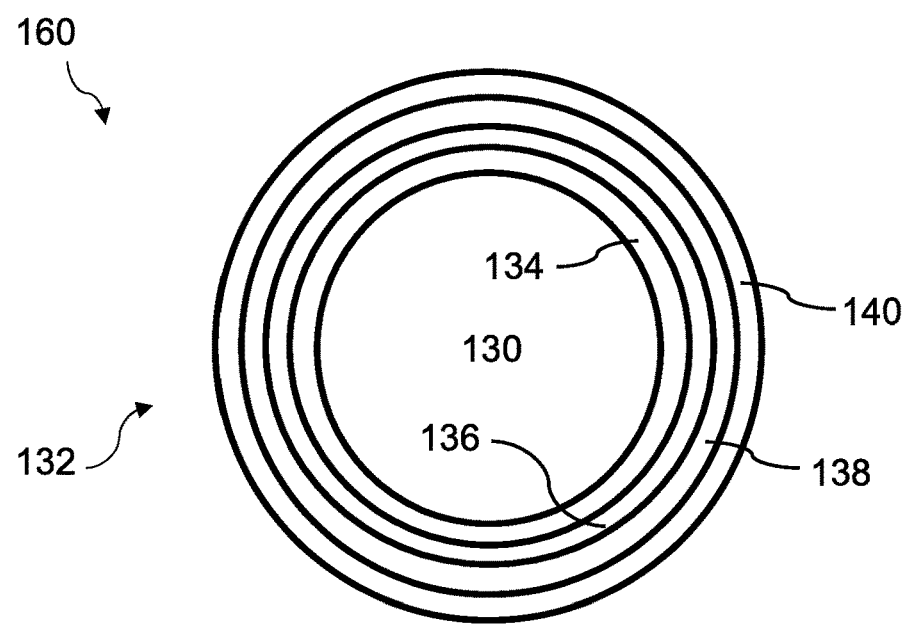

FIG. 8 illustrates cross-sectional views of a first embodiment 160 of the conductive wire 102-109. FIG. 8(a) shows a cross-sectional view along the longitudinal axis; and FIG. 8(b) shows another cross-sectional view across the longitudinal axis. The conductive wire 102-109 comprises an inner layer or core 130 and a cover layer 132. The cover layer 132 substantially completely encapsulates the inner layer 130 inside the conductive wire 102-109. The inner layer 130 has a diameter of 0.3 to 5 mils; while the cover layer 132 has a thickness of 0.1 to 0.5 mils. The inner layer 130 is made of stainless steel having a cubic crystal structure. Variation of the cubic crystal structure (such as face centered cubic) gives the stainless steel sufficient ductility for allowing an elastic bending of the inner layer 130 while the conductive wire 102-109 is wound or braided into the tubular configuration of the unitary structure 110.

The cover layer 132 further comprises a Copper plating layer 134, a Nickel plating layer 136; a Palladium plating layer 138 and a Gold plating layer 140 from an inner side to an outer side of the first conductive wire 102. The Copper plating layer 134, the Nickel plating layer 136; the Palladium plating layer 138 and the Gold plating layer 140 have a first thickness more than 2.0 micrometers (μm), a second thickness of more than 1.0 micrometer, a third thickness less than 1.0 micrometer and a fourth thickness more than 1.0 micrometer respectively.

Figure 9:
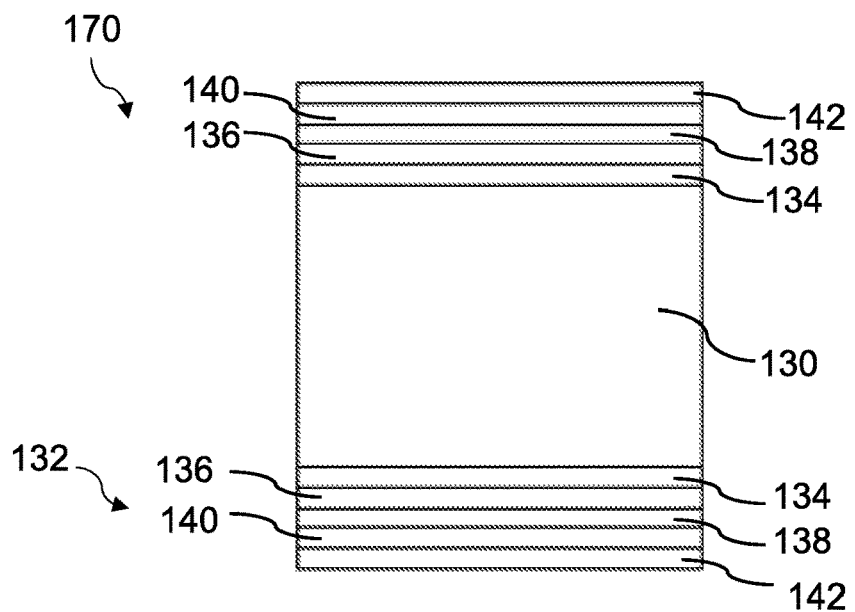
FIG. 9 illustrates cross-sectional views of a second embodiment of the conductive wire.
Figure 9:
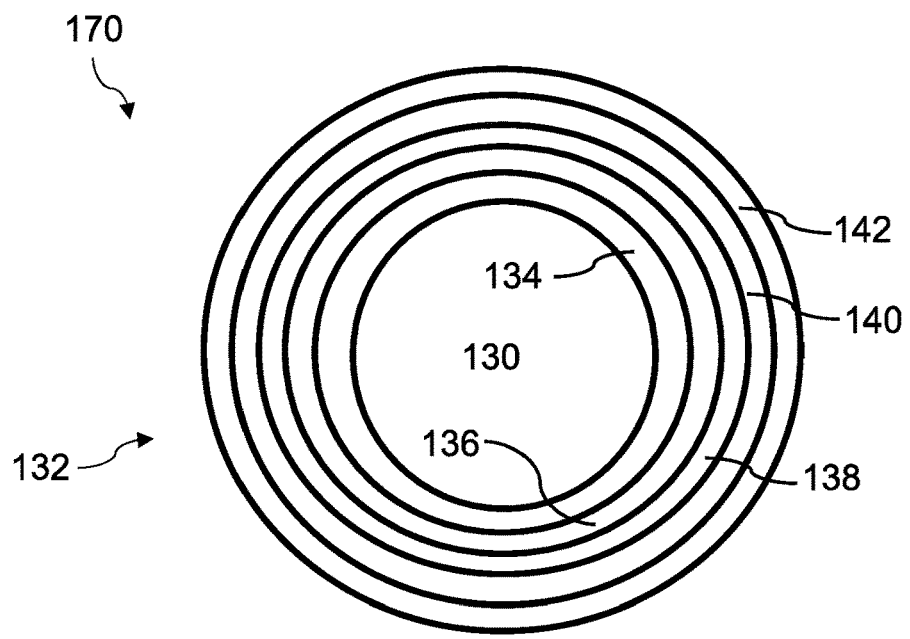

FIG. 9 illustrates cross-sectional views of a second embodiment 170 of the conductive wire 102-109. FIG. 9(a) shows a cross-sectional view along the longitudinal axis; and FIG. 9(b) shows another cross-sectional view across the longitudinal axis. The second embodiment 170 has a similar structure with that of the first embodiment 160 except that the conductive wire 102-109 comprises a self-assembled-molecules (SAM) layer 142 for preventing oxidation of the cover layer 132 and the inner layer 130. The SAM layer 142 has a thickness less than 0.5 micrometer (μm). Moreover, the inner layer 130 may be alternatively made of Copper alloy, instead of stainless steel.

Figure 10:
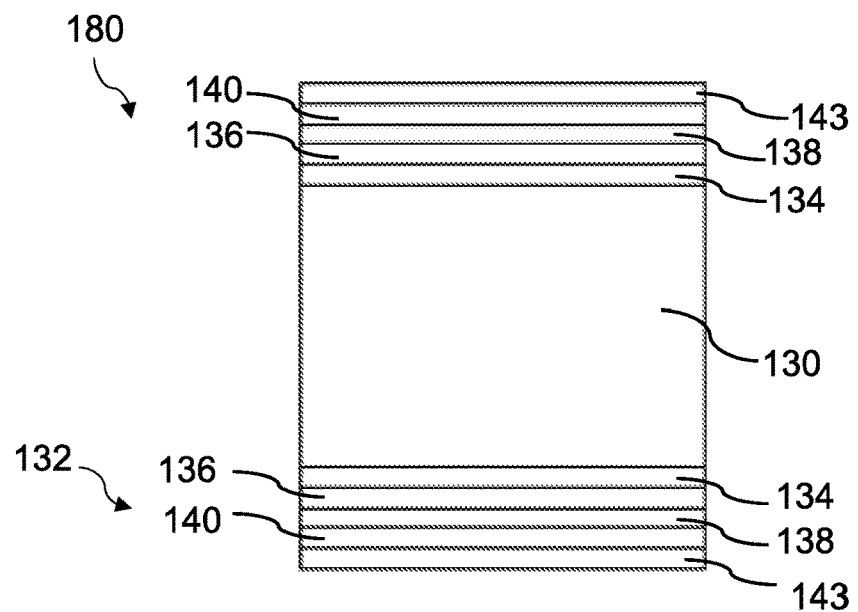
FIG. 10 illustrates cross-sectional views of a third embodiment of the conductive wire.
Figure 10:
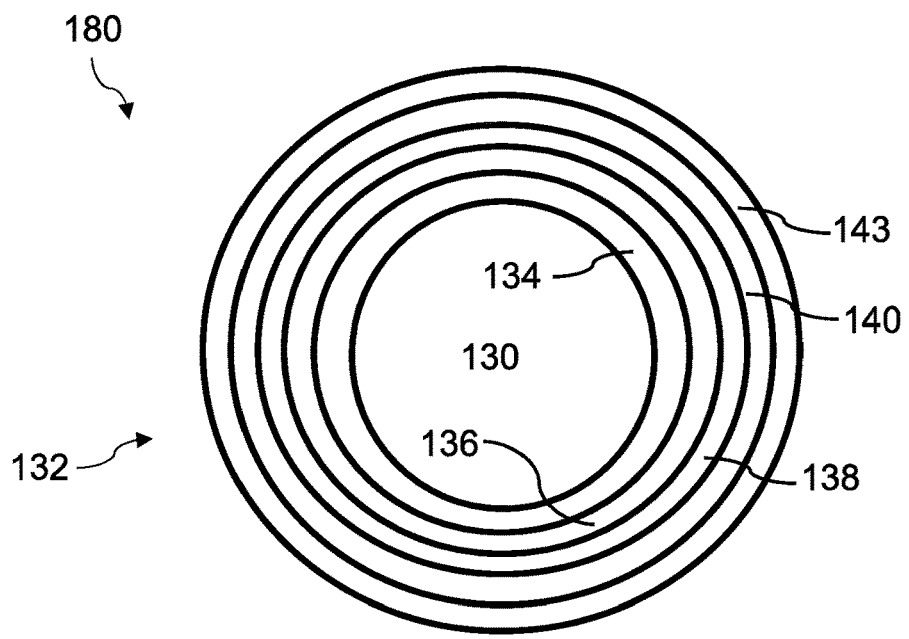

FIG. 10 illustrates cross-sectional views of a third embodiment 180 of the conductive wire 102-109. FIG. 10(a) shows a cross-sectional view along the longitudinal axis; and FIG. 10(b) shows another cross-sectional view across the longitudinal axis. The third embodiment 180 has a similar structure with that of the second embodiment 170 except that the conductive wire 102-109 comprises a parylene coating 143 instead of the SAM layer 142. The parylene coating 143 has a thickness less than 0.5 micrometer (μm). Moreover, the inner layer 130 may be alternatively made of Copper alloy, instead of stainless steel.

Figure 11:
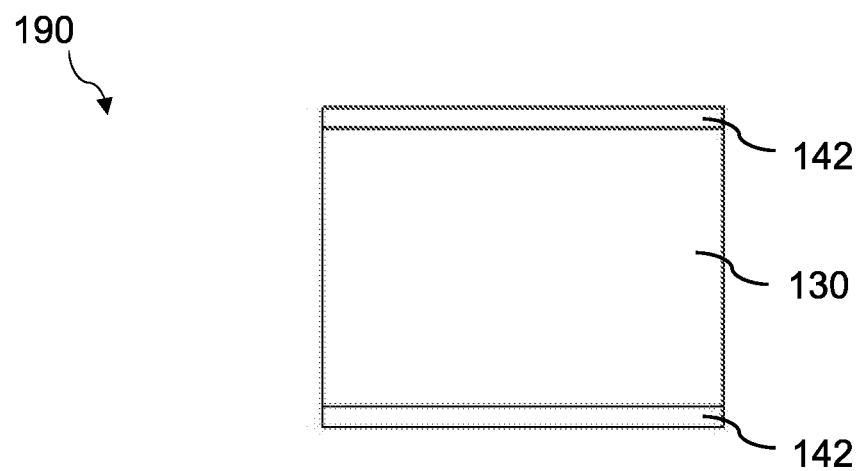
FIG. 11 illustrates cross-sectional views of a fourth embodiment of the conductive wire.
Figure 11:
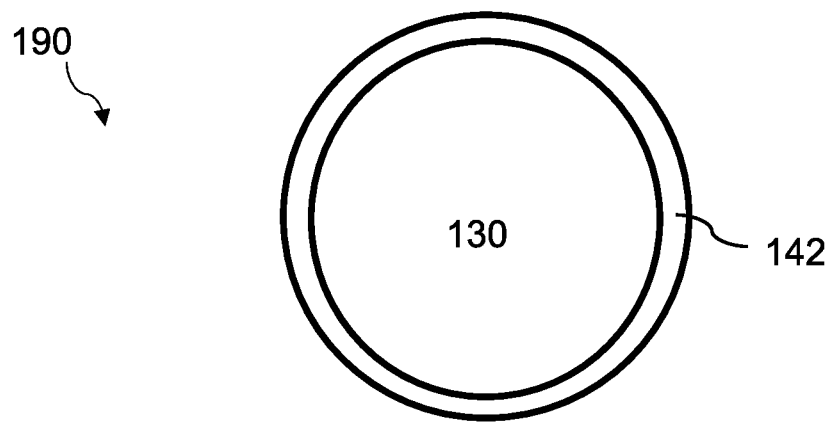

FIG. 11 illustrates cross-sectional views of a fourth embodiment 190 of the conductive wire 102-109. FIG. 11(a) shows a cross-sectional view along the longitudinal axis; and FIG. 11(b) shows another cross-sectional view across the longitudinal axis. Similarly, the conductive wire 102-109 comprises the inner layer 130 and the cover layer 132. However, the cover layer 132 comprises only a self-assembled-molecules (SAM) layer 142 directly on the inner layer 130 for preventing oxidation of the inner layer 130. The SAM layer 142 also has a thickness less than 0.5 micrometer (μm). In addition, the inner layer 130 is made of Copper alloy only.

Figure 12:
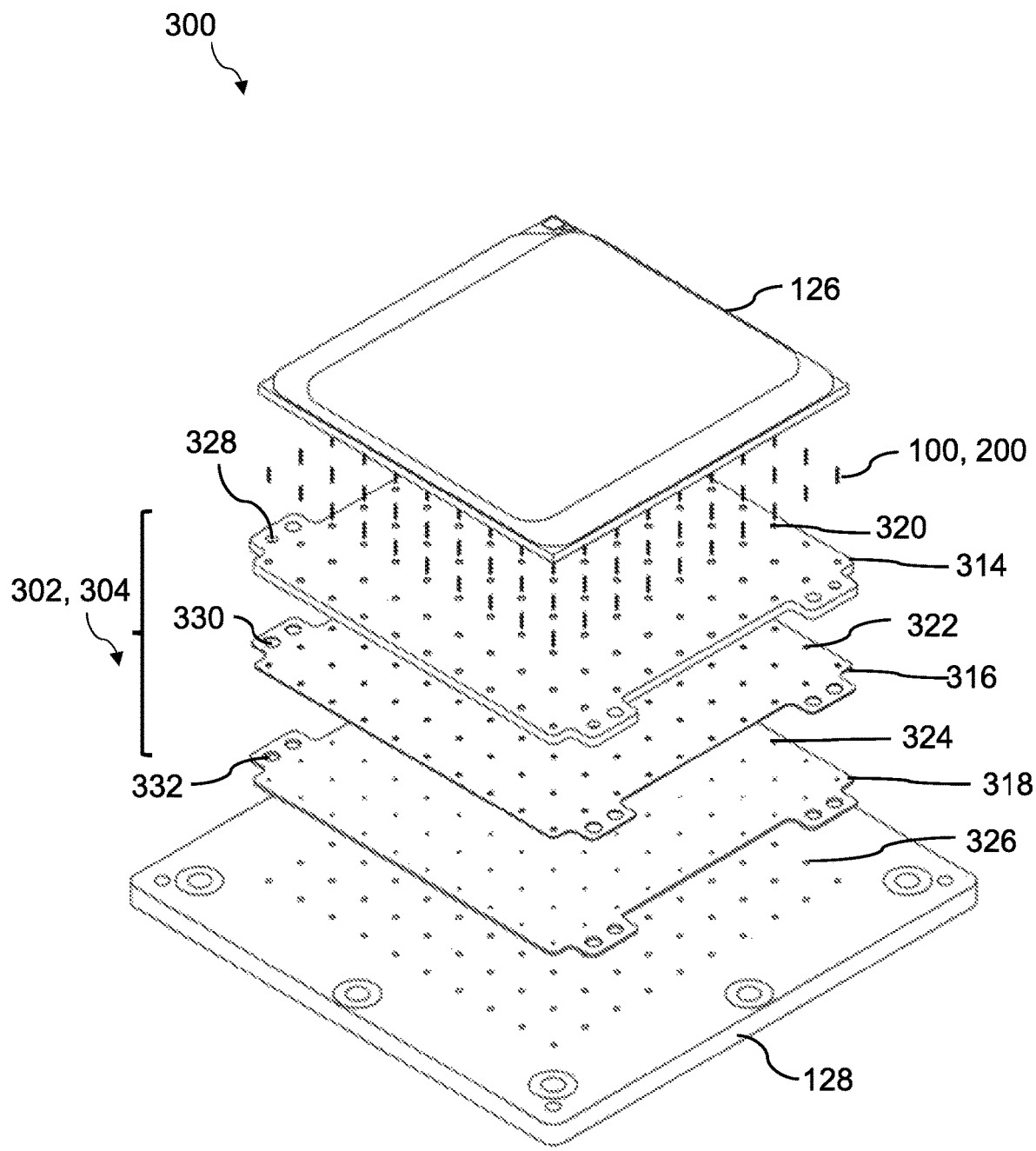
FIG. 12 illustrates a perspective exploded view of a first electrical contact system.

FIG. 12 illustrates a perspective exploded view of a first electrical contact system 300. The first electrical contact system 300 comprises a plurality of elastic electrical contacts 100, 200 and a housing or carrier 302 defining a plurality of through openings 304. The elastic electrical contacts 100, 200 are placed in the through openings 304 respectively. The housing 302 has a sandwiched structure comprising a top layer 314, a bottom layer 318 and a middle layer 316 sandwiched between the top layer 314 and the bottom layer 318. The top layer 314 and the bottom layer 318 are made of insulating materials such as polyimide; while the middle layer 316 is made of Copper or Copper alloy. Accordingly, the through opening 304 has a first through opening 320, a second through opening 322 and a third through opening 324 throughout the top layer 314, the middle layer 316 and the bottom layer 318 respectively. The first through opening 320, the second through opening 322 and the third through opening 324 are aligned precisely for forming the through opening 304. The PCB 128 also has a plurality of recesses 326 that are aligned with their respective through openings 320 for guiding and receiving the elastic electrical contacts 100, 200. In addition, the top layer 314, the middle layer 316 and the bottom layer 318 have a first hole 328, a second hole 330 and a third hole 332 at their peripheries respectively. A carrier fastener (such as a bolt or a screw) is used to combine the top layer 314, the middle layer 316 and the bottom layer 318 into the housing 302 as a whole by inserting the carrier fastener through the first hole 328, the second hole 330 and the third hole 332. In addition, the housing 302 further comprises a top fastener 306 (such as a top clasp) (not shown) and a bottom fastener 308 (such as a bottom clasp) (not shown) for fixing the housing 302 to the IC device 126 and the PCB 128 respectively. Therefore, the IC device 126 and the PCB 128 may be precisely aligned to the elastic electrical contact 100, 200 in the housing 302 respectively.

Figure 13:
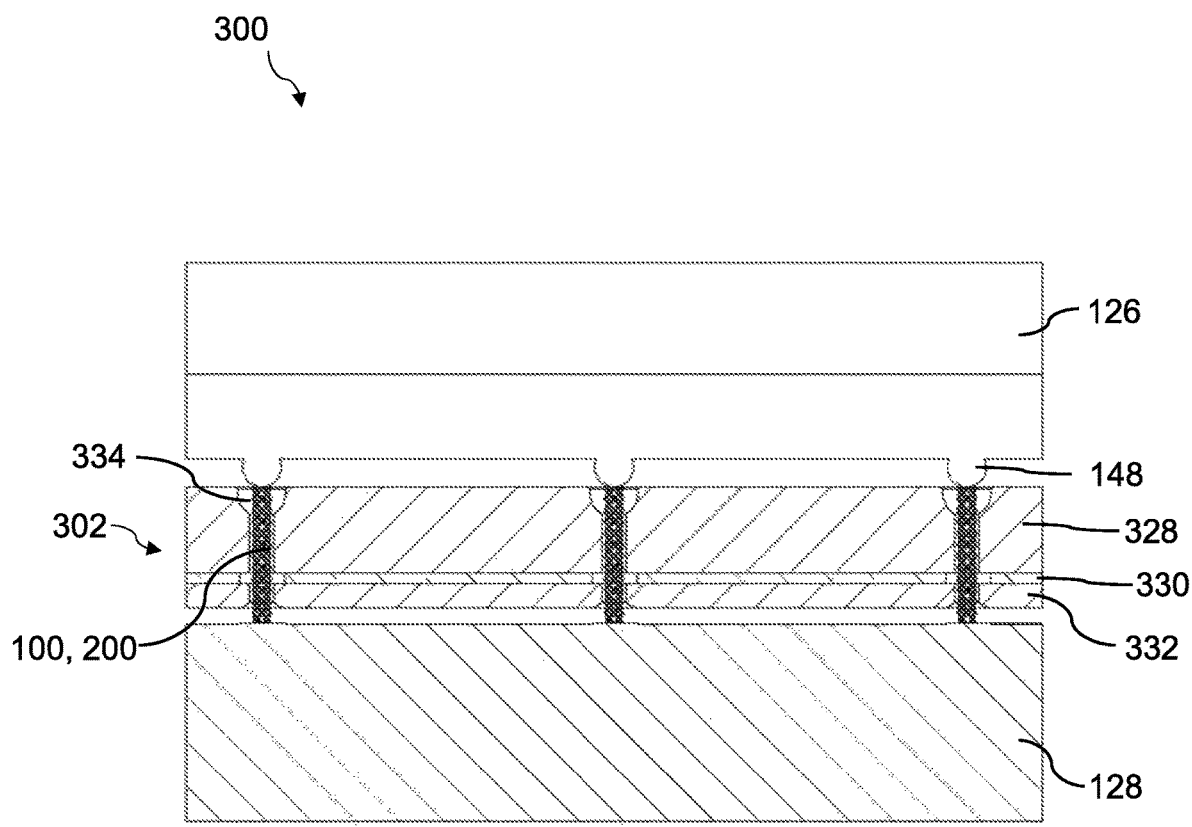
FIG. 13 illustrates a cross-sectional view of the first electrical contact system.

FIG. 13 illustrates a cross-sectional view of the first electrical contact system 300. It is clearly shown that the elastic electrical contacts 100, 200 are placed inside their respective through openings 304. The through opening 304 has a depth 310 substantially equal to the thickness of the carrier 302; and a diameter 312 of 0.1 to 0.8 mm. The neutral length 118 is obviously longer than the depth 310 such that the top end 122 and the bottom end 124 are exposed from the through opening 304 for getting in physical contact with the IC device 126 and the PCB 128 simultaneously. In contrast, the diameter 312 is slightly larger than the neutral diameter 116 for guiding the elastic electrical contact 100, 200 into the through opening 304. Therefore, the elastic electrical contact 100, 200 still keeps a standing configuration once the elastic electrical contact 100, 200 falls into the through opening 304. Meanwhile, the through opening 304 also restricts the elastic electrical contact 100, 200 from excessive lateral deformation when the elastic electrical contact 100, 200 are compressed. In addition, the IC device 126 in FIG. 13 comprises an IC chip; therefore, the IC chip is connected to the elastic electrical contacts 100, 200 via solder balls 148. The top layer 314 also has a plurality of grooves 334 for locating and receiving their respective solder balls 148.

Figure 14:
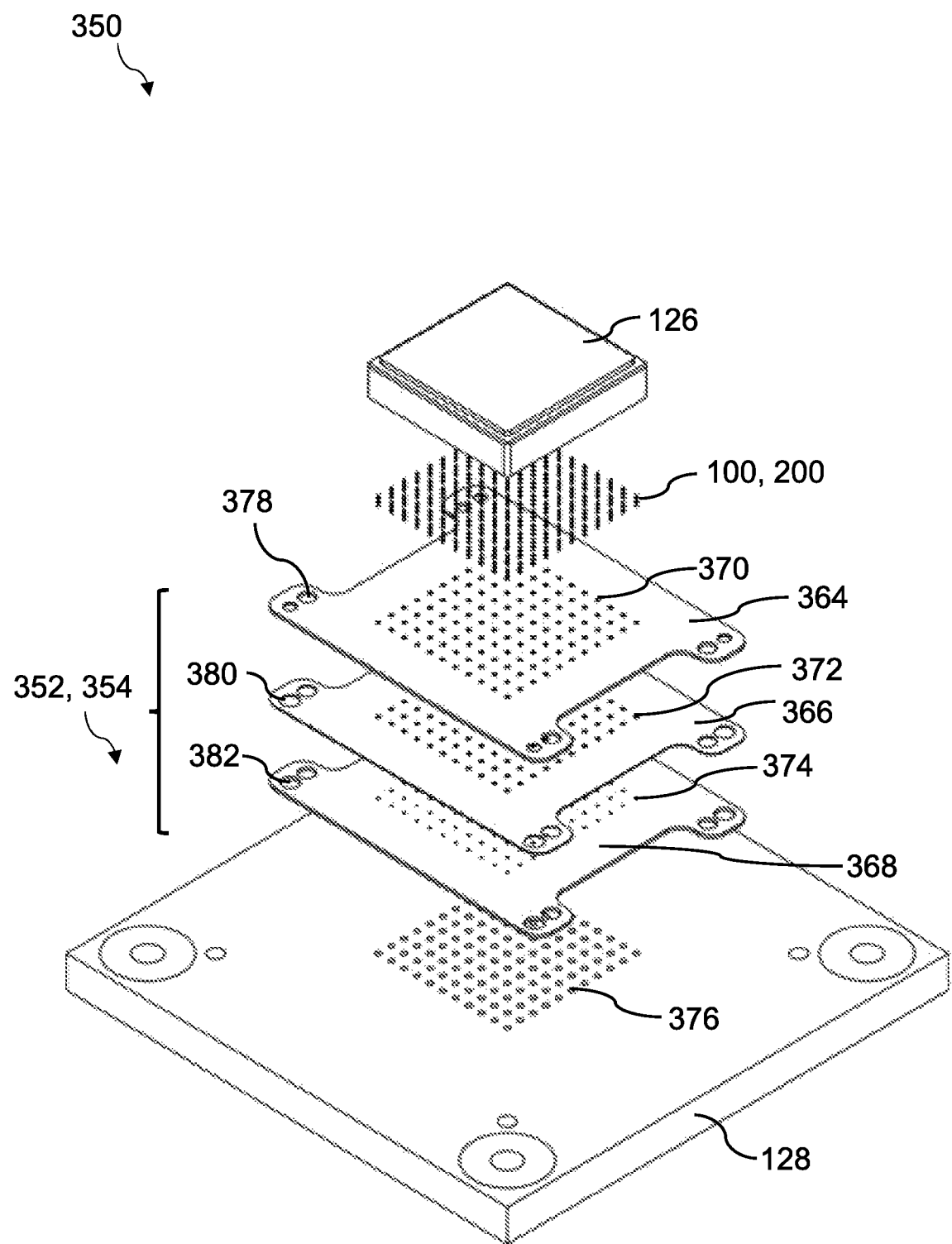
FIG. 14 illustrates a perspective exploded view of a second electrical contact system.

FIG. 14 illustrates a perspective exploded view of a second electrical contact system 350. The second electrical contact system 350 has a similar structure with the first electrical contact system 300, comprising the elastic electrical contacts 100, 200 and a housing or carrier 352. The carrier 352 has a plurality of through openings 354 for accommodating the elastic electrical contacts 100, 200. The carrier 352 also has a substantially same sandwiched structure as the housing 302, comprising a top layer 364, a bottom layer 368 and a middle layer 366 between the top layer 364 and the bottom layer 368. The top layer 364 has a first through opening 370 and a first hole 378; the middle layer 366 has a second through opening 372 and a second hole 380; and the bottom layer 368 has a third through opening 374 and a third hole 382. The first through opening 370, the second through opening 372 and the third through opening 374 are aligned for forming the through opening 354. The first hole 378, the second hole 380 and the third hole 382 are also aligned for a carrier fastener (such as a bolt or a screw) to combine the top layer 364, the middle layer 366 and the bottom layer 368 into the carrier 352 as a whole.

Figure 15:
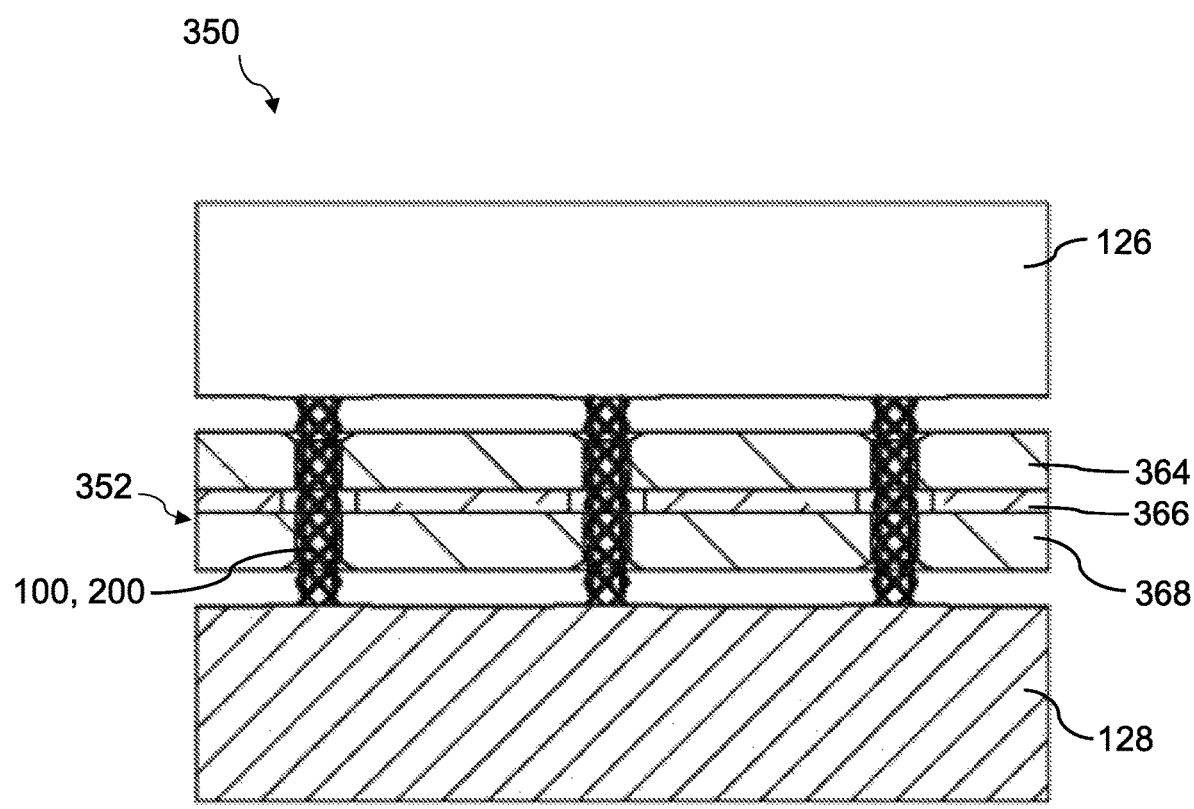
FIG. 15 illustrates a cross-sectional view of the second electrical contact system.

FIG. 15 illustrates a cross-sectional view of the second electrical contact system 350. The second electrical contact system 350 has a similar structure with the first electrical contact system 300. However, the IC device 126 in FIG. 15 comprises an IC package having external contact pads. Therefore, the IC package is directly connected to the elastic electrical contacts 100, 200 without using the solder balls 148. Accordingly, the top layer 364 does not need to have a structure similar to the groove 334 for the first electrical contact system 300.

Figure 16:
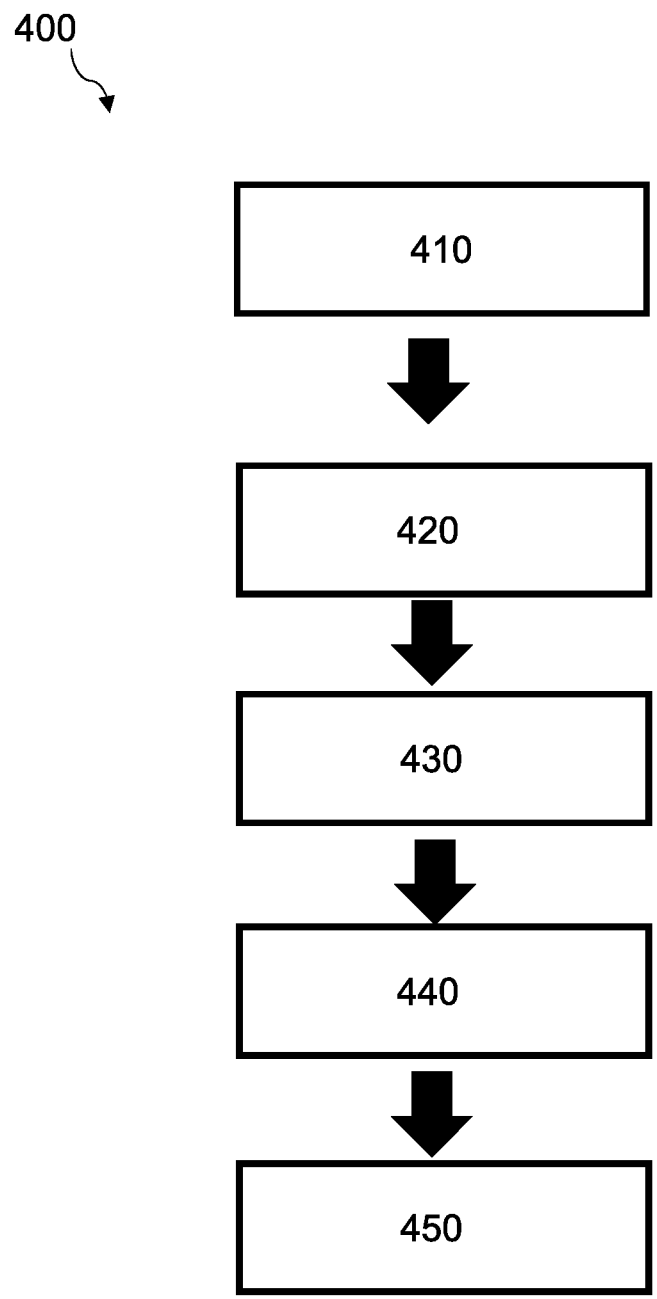
FIG. 16 illustrates a processing diagram of making the elastic electrical contact.

FIG. 16 illustrates a processing diagram 400 of making the elastic electrical contact 100. The processing diagram 400 comprise a first step 410 of providing eight conducive wires 102-109; a second step 420 of interlacing or braiding the eight conductive wires 102-109 into the unitary structure 110; a third step 430 of releasing an internal stress of the unitary structure 110 that is generated in the second step 420; a fourth step 440 of cutting the unitary structure 110 into a plurality of elastic electrical contact 100; and a fifth step 450 of plating the elastic electrical contact 100 with the cover layer 132.

Figure 17:
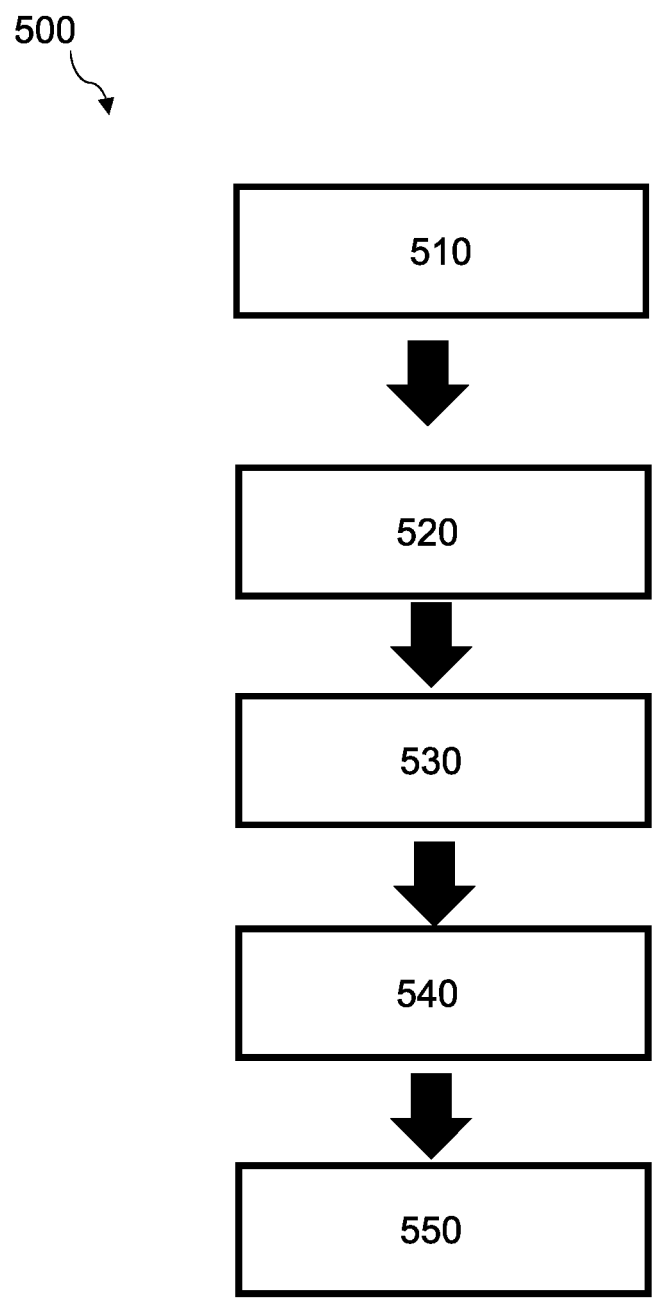
FIG. 17 illustrates a processing diagram of forming a cover layer of the elastic conductive contact.

FIG. 17 illustrates a processing diagram 500 of forming the cover layer 132 of the elastic electrical contact 100. The processing diagram 500 comprises a first step 510 of cleaning the inner layer 130; a second step 520 of producing the Nickel plating layer 136 encapsulating the inner layer 130 by a Nickel electrolysis plating process until the Nickel plating layer 136 is thicker than 1.0 micrometer (μm); a third step 530 of producing the Palladium plating layer 138 encapsulating the Nickel plating layer 136 by a Palladium electrolysis plating process until the Palladium plating layer 138 is substantially around 1.0 micrometer (μm); a fourth step 540 of producing the Gold plating layer 140 encapsulating the Palladium plating layer 138 by a Gold electrolysis plating process until the Gold plating layer 140 is thicker than 1.0 micrometer (μm); and a fifth step 550 of drying the cover layer 132 of elastic electrical contact 100.

In the application, unless specified otherwise, the terms "comprising", "comprise", and grammatical variants thereof, intended to represent "open" or "inclusive" language such that they include recited elements but also permit inclusion of additional, non-explicitly recited elements.

As used herein, the term "about", in the context of concentrations of components of the formulations, typically means +/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. The description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

It will be apparent that various other modifications and adaptations of the application will be apparent to the person skilled in the art after reading the foregoing disclosure without departing from the spirit and scope of the application and it is intended that all such modifications and adaptations come within the scope of the appended claims.

REFERENCE NUMERALS 100 elastic electrical contact;
102 first conductive wire;
103 second conductive wire;
104 third conductive wire;
105 fourth conductive wire;
106 fifth conductive wire;
107 sixth conductive wire;
108 seventh conductive wire;
109 eighth conductive wire;
110 unitary structure;
112 intersection point;
114 pitch;
116 neutral diameter;
118 neutral length;
120 lead;
122 top end;
124 bottom end;
126 IC device;
128 printed circuit board (PCB);
130 inner layer;
132 cover layer;
134 Copper plating layer;
136 Nickel plating layer;
138 Palladium plating layer;
140 Gold plating layer;
142 self-assembled-molecules (SAM) layer;
143 parylene coating;
144 resting state;
146 compressed state;
147 compressed length;
148 solder ball;
152 first top sharp edge;
153 second top sharp edge;
154 third top sharp edge;
155 fourth top sharp edge;
156 fifth top sharp edge;
157 sixth top sharp edge;
158 seventh top sharp edge;
159 eighth top sharp edge;
160 first embodiment of the conductive wire;
170 second embodiment of the conductive wire;
180 third embodiment of the conductive wire;
190 fourth embodiment of the conductive wire;
200 elastic electrical contact;
202 first conductive wire;
203 second conductive wire;
204 third conductive wire;
205 fourth conductive wire;
206 fifth conductive wire;
207 sixth conductive wire;
208 seventh conductive wire;
209 eighth conductive wire;
210 unitary structure;
300 first electrical contact system;
302 housing or carrier;
304 through opening;
306 top fastener;
308 bottom fastener;
310 depth;
312 diameter;
314 top layer;
316 middle layer;
318 bottom layer;
320 first through opening;
322 second through opening;
324 third through opening;
326 recess;
328 first hole;
330 second hole;
332 third hole;
334 groove;
350 second electrical contact system;
352 housing or carrier;
354 through opening;
364 top layer;
366 middle layer;
368 bottom layer;
370 first through opening;
372 second through opening;
374 third through opening;
378 first hole;
380 second hole;
382 third hole;
400 processing diagram of making the elastic electrical contact;
410 first step;
420 second step;
430 third step;
440 fourth step;
450 fifth step;
500 processing diagram of forming the cover layer;
510 first step;

520 second step;
530 third step;
540 fourth step;
550 fifth step;

The invention claimed is:

1. An elastic electrical contact, comprising
at least three discrete wires interlaced and mutually supported for forming a unitary structure, wherein the at least three discrete wires comprise at least one electrically conductive wire for providing a first electrical contact and a second electrical contact;
and at least two intersecting wires of the unitary structure form a substantially right angle in the absence of external force,
wherein the at least one electrically conductive wire comprises multiple layers, and the multiple layers comprise:
an inner layer that is elastic; and
a cover layer for encapsulating the inner layer for resisting corrosion and enhancing electrical conductivity of the at least one electrically conductive wire,
wherein the multiple layers further comprise an outer layer for encapsulating both the inner layer and the cover layer for preventing oxidation to the inner layer and the cover layer, and
wherein the outer layer comprises a self-assembled-molecules (SAM) layer for preventing oxidation of the cover layer and the inner layer.

2. The elastic electrical contact of claim 1, wherein the unitary structure comprises a tubular structure.

3. The elastic electrical contact of claim 2, wherein the tubular structure has an original length in a range of 50 to 100 mils.

4. The elastic electrical contact of claim 1, wherein the inner layer comprises a steel material.

5. The elastic electrical contact of claim 1, wherein the cover layer comprises
a Nickel layer plated on the inner layer; and
a Gold layer plated on the Nickel plated layer.

6. An electrical contact system, comprising
a plurality of elastic electrical contacts of claim 1; and
a carrier comprising a plurality of through openings;
wherein at least one of the plurality of elastic electrical contacts is placed in one of the plurality of through openings.

7. The electrical contact system of claim 6, wherein the carrier comprises
a top layer;
a bottom layer; and
a middle layer sandwiched between the top layer and the bottom layer.

8. The electrical contact system of claim 7, wherein the middle layer is made of a thermal conductive material.

9. The elastic electrical contact of claim 1, wherein the unitary structure has an elastic deformation not homogeneous along the unitary structure.

\* \* \* \* \*